United States Patent [19]
Morris et al.

[11] Patent Number: 5,572,725
[45] Date of Patent: Nov. 5, 1996

[54] EPITAXIALLY STRENGTHENED SINGLE CRYSTAL ALUMINUM GARNET REINFORCEMENT FIBERS

[75] Inventors: Robert C. Morris; Devlin M. Gualtieri, both of Ledgewood; Dave Narasimhan, Flemington; Philip J. Whalen, Sparta, all of N.J.

[73] Assignee: AlliedSignal, Inc., Morris Township, N.J.

[21] Appl. No.: 143,030

[22] Filed: Oct. 29, 1993

Related U.S. Application Data

[63] Continuation-in-part of Ser. No. 867,569, Apr. 13, 1992, abandoned.

[51] Int. Cl.$^6$ .................................. B22F 7/04; B22F 7/08
[52] U.S. Cl. ...................... 428/555; 428/373; 428/375; 428/392; 428/400; 428/404; 428/610; 428/615; 428/567; 428/568; 428/548; 428/552; 428/554
[58] Field of Search ........................... 428/373, 375, 428/392, 400, 404, 610, 615, 567, 568, 548, 552, 554, 555

[56] References Cited

FOREIGN PATENT DOCUMENTS

| 0195353 | 9/1986 | European Pat. Off. .......... D01F 9/12 |
| 49-020370 | 5/1974 | Japan .............................. C04B 35/72 |
| 61-242997 | 10/1986 | Japan .............................. C30B 29/28 |

OTHER PUBLICATIONS

J. K. Weddell, "Continuous Ceramic Fibres", Journal of the Textile Institute, (1990), vol. 81, No. 4, pp. 333–359.

Morris et al., "Epitaxial Strengthening of Crystals", U.S. Statutory Invention Registration, Reg. No. H557, pub. Dec. 6, 1988.

J. E. Marion, "Compressive epitactic layers on single–crystal components for improved mechanical durability and strength", J.Appl. Physics, 62, No. 5, Sep. 1, 1987, pp. 2065–69.

J. E. Mee et al., "Chemical Vapor Deposition of Epitaxial YIG on YAG and Epitaxial GdIG on YAG", Appl, Phys. Lett., 10, No. 10; pp. 289–291, May 15, 1967.

D. M. Gualtieri, "Fe–YIG: Narrow x–ray linewidth epitaxial layers on $Gd_3Ga_5O_{12}$" J. Appl. Phys., 63, No. 8, apr. 1988, pp. 3795–3797.

J. C. Lambropoulos, "Toughening and crack tip shielding in brittle materials by residually stressed thin films", J. Vac. Sci. Technol., A9(4), Jul./Aug. 1991.

P. H. Kobrin et al., "The effects of thin compressive films on identation fracture toughness measurements", J. Mat. Sci., 24 pp. 1363–1367 (1989).

*Primary Examiner*—Patrick J. Ryan
*Assistant Examiner*—Rid Weisberger
*Attorney, Agent, or Firm*—Verne E. Kreger, Jr.

[57] ABSTRACT

Reinforcement fibers are formed from a single crystal garnet body—suitably an aluminum garnet, desirably a rare earth aluminum garnet—having an epitaxial surface layer of a second garnet having a lattice constant larger than that of the body garnet so as to provide a compressive strain, to thereby strengthen the fiber.

23 Claims, No Drawings

EPITAXIALLY STRENGTHENED SINGLE CRYSTAL ALUMINUM GARNET REINFORCEMENT FIBERS

CROSS-REFERENCE TO RELATED APPLICATION

This application is a continuation-in part of commonly assigned U.S. appl. Ser. No. 867,569 filed 13 Apr. 1992 abandoned.

FIELD OF THE INVENTION

This invention relates to fibers for reinforcement applications and provides new single crystal fiber structures, more particularly single crystal aluminum garnet fiber structures which are surface strengthened. They are suitable for use as reinforcement in structural composites, particularly ceramic or metal matrix composites for high temperature applications.

BACKGROUND OF THE INVENTION

Choice of materials of construction for mechanically demanding high temperature applications—particularly under reactive environments, such as oxidizing environments—is very limited. Lack of such materials, for example, imposes limits on the performance of turbine engines for both power generation and aircraft propulsion. In turbine engines for aircraft, a high output to weight ratio is desired. Engine efficiency increases with increasing temperatures in the combustion section. The temperature limiting factor in this application is availability of materials of construction for turbine airfoils. These are presently made of nickel-based superalloys, but metals technology is approaching the upper temperature limit, and new materials of construction are needed to provide further advances. Ceramics, especially oxide ceramics have been suggested for this application, because of theoretical big strength and oxidation resistance. However, lack of mechanical durability and strength in actual application has prevented their use in this demanding application. These deficiencies could be overcome by incorporating reinforcing fibers into the ceramic body, to provide a ceramic matrix composite. Unfortunately, suitable reinforcing fibers have heretofore not been available.

This invention provides surface strengthened single crystal oxide fibers, particularly aluminum garnet fibers, which can be used for reinforcement in ceramic and metal matrix composites, which are suitable for use in high temperature environment, including oxidizing environments. These fibers are strengthened and protected against environmental attack and mechanical damage by provision of an epitaxial compressive surface coating, which puts the surface of the fiber under significant compression.

Compressive surface layers are employed widely to improve the low temperature strength and impact resistance of brittle solids and objects. A common example is "tempered" glass for automotive and architectural applications. Surface compression is achieved by a variety of methods including heat treatment, shot peening and ion exchange. The stresses produced by these methods generally relax upon exposure of the solid to temperatures in excess of about 0.5 times the absolute melting point.

Compressive epitaxially deposited layers have previously been provided on single crystal laser media, including on single crystal yttrium aluminum garnet laser rods for improvement of low temperature strength and durability (U.S. Statutory Invention Registration H557 by Morris et al. for "Epitaxial Strengthening of Crystals"; Marion et al., *Compressive epitactic layers on single-crystal components for improved mechanical durability and strength*, J. Appl. Phys. 62, 2065–2069 (1987)).

SUMMARY OF THE INVENTION

The present invention provides single crystal oxide reinforcement fibers comprising an elongated fiber body formed from a single crystal aluminum garnet, on which fiber body there is deposited an epitaxial garnet layer which provides a strain of from about 0.02 to about 0.40% on the single crystal garnet fiber body. The single crystal aluminum garnet desirably is a single crystal rare earth aluminum garnet, more desirably an yttrium aluminum garnet (YAG).

This invention also provides a method for forming a single crystal oxide reinforcing fiber which comprises forming a single crystal elongated fiber body of aluminum garnet and depositing on its surface an epitaxial garnet layer having lattice dimensions greater than those of the underlying fiber body so that the lattice mismatch provides a compressive strain of from about 0.02 to about 0.40% relative to the single crystal garnet fiber body.. To retain maximum inherent strength characteristics of the pristine as-grown fiber, it should be protected against surface damage until the application of the compressive surface layer has been completed. Thereafter, the fiber can be handled in the usual manner.

This invention further provides fiber-reinforced composites comprising a metal or ceramic matrix, particularly a high-temperature oxide ceramic matrix, reinforced with single crystal aluminum garnet fibers which are coated with an epitaxial garnet layer which provides a strain of from about 0.02 to about 0.40% on the fiber body.

DETAILED DESCRIPTION OF THE INVENTION

Garnets are oxide-containing crystals of complex structure which crystallize in the cubic system. Naturally occurring silicate garnets have high hardness; they have been used as abrasives. Synthetic garnets have been much studied recently since they include magnetic materials of importance to microwave applications and for information storage. Neodymium-substituted yttrium aluminum garnets have found wide use as laser hosts. For detailed information on garnets, their composition and lattice structure, reference is made to Landolt-Bornstein, *Numerical Data and Functional Relationships in Science and Technology, New Series Group III; Crystal and Solid State Physics,* Vol. 12, Magnetic and Other Properties of Oxides and Related Compounds, Part (a), Garnets and Perovskites, K. H. Hellwege, Ed.-in-Chief, Springer Verlag; Berlin, Heidelberg, New York, 1978.

We have found that rare earth substituted aluminum garnets have high strength, and oxidation and creep resistance at high temperatures which make them eminently suitable as reinforcing fibers for metal matrix and ceramic matrix composites for high temperature applications. Suitable rare earth aluminum garnet compositions for these fibers include yttrium aluminum garnet (YAG, $Y_3Al_5O_{12}$), holmium aluminum garnet (HoAG, $Ho_3Al_5O_{12}$), as well as:

| | |
|---|---|
| $Lu_3Al_5O_{12}$ | $Y_3Al_3Sc_2O_{12}$ |
| $Yb_3Al_5O_{12}$ | $Dy_3Al_3Sc_2O_{12}$ |
| $Tm_3Al_5O_{12}$ | $Tb_3Al_3Sc_2O_{12}$ |
| $Er_3Al_5O_{12}$ | $Gd_3Al_3Sc_2O_{12}$ |

| | |
|---|---|
| $Dy_3Al_5O_{12}$ | $Eu_3Al_3Sc_2O_{12}$ |
| $Tb_3Al_5O_{12}$ | |
| $Gd_3Al_5O_{12}$ | |

The composition of the garnet material for the fiber is preferably congruently melting, to simplify fiber growth. Of the above-mentioned rare earth substituted aluminum garnets, yttrium aluminum garnet is preferred for reasons of cost, availability, high temperature strength and high temperature oxidative stability, high modulus and low density. The physical characteristics of yttrium aluminum garnet are set forth in Table I, below:

TABLE I

| | |
|---|---|
| Density | 4.53 g/cm$^3$ |
| Melting Point | 1950° C. |
| Debye Temperature | 750 K. |
| Thermal Conductivity (at 25° C.) | 0.13 W/cm/K. |
| Refractive Index (at 550 nm) | 1.84 |
| Hardness (at 25° C.) | $1.7 \times 10^3$ kg/mm$^2$ |
| Hardness (at 1400° C.) | $0.49 \times 10^3$ kg/mm$^2$ |
| Coeff. of Thermal Exp. (at 25° C.) | 7.5 ppm/°C. |
| $c_{11}$ | $33.35 \times 10^{11}$ dyne/cm$^2$ |
| $c_{12}$ | $11.1 \times 10^{11}$ dyne/cm$^2$ |
| $c_{44}$ | $11.5 \times 10^{11}$ dyne/cm$^2$ |
| Bulk Modulus | $18.8 \times 10^{11}$ dyne/cm$^2$ |
| Young's Modulus | $28.7 \times 10^{11}$ dyne/cm$^2$ |
| Shear Modulus | $11.5 \times 10^{11}$ dyne/cm$^2$ |
| Poisson's Ratio | 0.248 |
| Anisotropy Ratio $[(2c_{44})/(c_{11}-c_{12})]$ | 1.034 |

Single crystal rare earth-substituted aluminum garnets, including yttrium aluminum garnet, can be grown from the melt of the constituent oxides using known methods, such as the Czochralski technique or the Bridgman technique. In the former, the constituent raw material oxides—$Al_2O_3$ and $Y_2O_3$ in the case of yttrium aluminum garnet—are melted in a crucible made of refractory metal (e.g. tungsten, tantalum, molybdenum or iridium), usually by induction heating. A seed crystal attached to a rotating rod is brought into contact from above with the melt surface and is slowly withdrawn so that the melt crystallizes onto the seed material, thereby creating a single crystal boule. In the Bridgman technique, a melt is provided in a sealed container which is passed through a temperature gradient to effect nucleation and crystallization along the gradient.

An efficient method for growing fibers of these materials is the "edge-defined film-fed growth method" (EFG), also known as the Tyco method, (See U.S. Pat. No. 3,591,348) which involves slowly withdrawing a crystal from the meniscus formed at a die having the cross-sectional shape of the desired fiber.

Once the singly crystal fiber of the aluminum garnet has been obtained, it should be protected against contact with itself and with other hard substances before the epitaxial surface coat is applied. Such contact would create surface flaws which would furnish the starting point for brittle fractures. Previously known single oxide crystal fibers tend to have a wide statistical distribution of strength due to strength limiting surface flaws introduced during fiber processing. Additional fiber surface damage which may be introduced during composite fabrication on the unprotected fiber further degrades the fiber and, hence, the composite strength. In our process the as grown fiber is protected against surface degradation by the compressive epitaxial coating layer. Once the coating layer is applied, the fiber can safely be handled in the usual manner, and can be fabricated into composites of high strength. The epitaxial garnet compressive and protective layer serves three purposes: first, it protects the surface of the fiber against environmental attack; second, it preserves the pristine surface of the fiber; third, it places the fiber surface under compression.

As a general proposition, the epitaxial layer must be a garnet layer that is thermodynamically stable with respect to the matrix material into which the fiber is to be incorporated, and it must have a lattice constant slightly larger than, but still compatible with, that of the fiber body. These requirements impose restrictions on the composition of the layer, but these seem to be the only source for compositional restrictions. Suitably, the epitaxial garnet layer is a rare earth-substituted aluminum garnet. The lattice mismatch may be provided, for example, by choice of different garnets out of the class of aluminum garnets, or it may be provided by using the same garnet material as that used for the fiber body, but alloying it with elements having larger atomic volume than those present in the fiber body garnet in order to increase the lattice constant. For example, gadolinium-alloyed yttrium aluminum garnet and dysprosium aluminum garnet have larger lattice constants than yttrium aluminum garnet, and thus provide suitable material for the epitaxial layer on the latter.

The strain in the epitaxial overlayer can be determined by calculation from the known lattice constants of the body garnet and the epitaxial layer garnet. The lattice constants are determined using conventional X-ray procedures, as for example described in Bond in *Precision Lattice Constant Determination, Acta Cryst.* 13, 814–818 (1960); Bond, *Precision lattice constant determination: erratum, Acta Cryst.* A31, 698 (1975); Barns, *A Survey of Precision Lattice Parameter Measurements as a Tool for the Characterization of Single-Crystal Materials, Mater. Res. Bull.* 2, 273–282 (1967). From the known lattice constants, the stress in the epitaxial garnet layer can be calculated by methods described by Blank et al. in *The Growth of Magnetic Garnets by Liquid Phase Epitaxy, J. Cryst. Growth* 17, 302–311 (1972); and Besser et al., *A Stress Model for Heteroepitaxial Magnetic Oxide Films Grown by Chemical Vapor Deposition, Mater. Res. Bull.* 6, 1111–1124 (1971)

In general, maximum possible compressive strain is desired for the compressive layer. For the aluminum garnets produced by the liquid phase epitaxy crystal growth technique, this maximum strain corresponds to about 0.40% difference in lattice constant between layer and body, the lattice constant of the layer being larger than that of the body for compressive, as distinguished from tensile, strain. The maximum thickness for defect-free epitaxy is a function of the compressive strain. Dysprosium aluminum garnet, a composition with about 0.33% compressive strain with respect to yttrium aluminum garnet, can be prepared as defect-free epitaxial layers only to a thickness up to about 5 μm. For example, for layer compositions of the general formula:

$$(Y_{1-a-b}, R^1_a, R^2_b)_3 Al_3(Al_{1-c}, Sc_c)_2 O_{12}$$

the strain can be expressed as:

$$\text{Strain } (\%) = (a)(k_1) + (b)(k_2) + (c)(2.25)$$

where $k_1$ and $k_2$ are selected from Table II, below. Exemplary compositions compatible with a condition of 0.15% strain in this equation are shown below. Of course, layers of greater and lesser compression within the scope of this invention are workable also.

TABLE II

| $R^1, R^2$ | $k_1, k_2$ |
| --- | --- |
| Lu | −0.73 |
| Yb | −0.59 |
| Tm | −0.36 |
| Er | −0.16 |
| Y | 0.0 |
| Ho | 0.01 |
| Dy | 0.35 |
| Tb | 0.62 |
| Gd | 0.94 |
| Eu | 1.02 |
| Sm | 1.40 |
| Nd | 1.95 |
| Pr | 2.33 |
| La | 3.07 |

Exemplary pairs of suitable fiber body garnets and corresponding garnet compositions for the epitaxial layer are set forth in Table III, below:

TABLE III

| Body | Compressive Layer | Est. Comp. Strain (%) |
| --- | --- | --- |
| $Lu_3Al_5O_{12}$ | $Y_{0.61}Lu_{2.39}Al_5O_{12}$ | 0.15 |
| $Yb_3Al_5O_{12}$ | $Y_{0.76}Yb_{2.24}Al_5O_{12}$ | 0.15 |
| $Tm_3Al_5O_{12}$ | $Y_{1.26}Tm_{1.74}Al_5O_{12}$ | 0.15 |
| $Er_3Al_5O_{12}$ | $Y_{2.84}Er_{0.16}Al_5O_{12}$ | 0.15 |
| $Y_3Al_5O_{12}$ | $Y_{2.52}Gd_{0.48}Al_5O_{12}$ | 0.15 |
| $Y_3Al_5O_{12}$ | $Y_3Al_{4.86}Sc_{0.14}O_{12}$ | 0.15 |
| $Y_3Al_5O_{12}$ | $Dy_3Al_5O_{12}$ | 0.33 |
| $Ho_3Al_5O_{12}$ | $Y_{2.50}Gd_{0.50}Al_5O_{12}$ | 0.15 |
| $Ho_3Al_5O_{12}$ | $Y_3Al_{4.85}Sc_{0.15}O_{12}$ | 0.15 |
| $Ho_3Al_5O_{12}$ | $Dy_3Al_5O_{12}$ | 0.32 |
| $Dy_3Al_5O_{12}$ | $Dy_{2.24}Gd_{0.76}Al_5O_{12}$ | 0.15 |
| $Dy_3Al_5O_{12}$ | $Y_3Al_{4.52}Sc_{0.48}O_{12}$ | 0.15 |
| $Tb_3Al_5O_{12}$ | $Tb_{1.61}Gd_{1.39}Al_5O_{12}$ | 0.15 |
| $Tb_3Al_5O_{12}$ | $Y_3Al_{4.27}Sc_{0.33}O_{12}$ | 0.15 |
| $Gd_3Al_5O_{12}$ | $Gd_{1.20}Eu_{1.80}Al_5O_{12}$ | 0.15 |
| $Gd_3Al_5O_{12}$ | $Y_3Al_{3.96}Sc_{1.04}O_{12}$ | 0.15 |
| $Y_3Al_3Sc_2O_{12}$ | $Y_{2.60}Gd_{0.40}Al_3Sc_2O_{12}$ | 0.15 |
| $Dy_3Al_3Sc_2O_{12}$ | $Y_{1.48}Gd_{1.52}Al_3Sc_2O_{12}$ | 0.15 |
| $Tb_3Al_3Sc_2O_{12}$ | $Y_{0.65}Gd_{2.35}Al_3Sc_2O_{12}$ | 0.15 |
| $Gd_3Al_3Sc_2O_{12}$ | $Gd_{0.72}Eu_{2.28}Al_3Sc_2O_{12}$ | 0.15 |
| $Eu_3Al_3Sc_2O_{12}$ | $Eu_{1.20}Sm_{1.80}Al_3Sc_2O_{12}$ | 0.15 |
| $Y_3Al_5O_{12}$ | $Dy_{1.00}Ho_{2.00}Al_5O_{12}$ | 0.14 |
| $Y_3Al_5O_{12}$ | $Dy_{1.75}Ho_{1.25}Al_5O_{12}$ | 0.21 |

The compression (strain) to which the epitaxial overlayer is subjected resulting from the mismatch of the lattice constants should generally be in the order of at least 0.02% and up to about 0.40%, desirably up to about 0.20%, preferably up to about 0.15%, and more preferably yet up to about 0.10%

The epitaxial compressive garnet layer is applied using any suitable method including liquid phase epitaxy and chemical vapor deposition. Chemical vapor deposition has the advantage of ease of in-line fiber processing provided by this method. Other suitable methods may involve powder or slurry coating, followed by laser melting and resolidification of the surface.

The growth of epitaxial garnet layers by liquid phase epitaxy is a well known procedure. It has, for example, been described by Blank et al. in *The Growth of Magnetic Garnets by Liquid Phase Epitaxy, J. Cryst. Growth* 17, 302–311 (1972). Desirably, the epitaxial growth is performed in a cleanroom or a cleanhood, such as a class 100 cleanhood, using super-cooled lead oxide-fluxed epitaxial layer melts, employing an isothermal dipping technique. Exemplary epitaxial growth procedures are detailed in the Examples, below.

EXAMPLE 1

Epitaxial Cladding of YAG Fibers with (Y, Gd)$_3$Al$_5$O$_{12}$ and Ho$_3$Al$_5$O$_{12}$ Compressive Layers YAG fibers were prepared by the laser heated pedestal method in which the tip of a YAG rod is heated by laser radiation to form a puddle of molten liquid from which a fiber is drawn through pulling by a "seed" crystal. X-ray diffraction measurements of these fibers showed them to be crystalline and generally composed of extended regions of single crystal and twinned single crystal. Epitaxial layers of the compressive-strain composition (Y, Gd)$_3$Al$_5$O$_{12}$ were prepared on two 20 mm lengths of such 0.5 mm diameter YAG fibers using the melt composition shown in Table IV, below.

TABLE IV

Melt for the growth of epitaxial layers of
(Y,Gd)$_3$Al$_5$O$_{12}$ on Y$_3$Al$_5$O$_{12}$

| Oxide | Mole Fraction | Moles | Grams |
| --- | --- | --- | --- |
| PbO | 0.90024 | 4.29741 | 959.135 |
| Al2O3 | 0.01959 | 0.09351 | 9.535 |
| B2O3 | 0.07502 | 0.35812 | 24.932 |
| Y2O3 | 0.00387 | 0.01846 | 4.168 |
| Gd2O3 | 0.00129 | 0.00615 | 2.230 |
|  | 1.00000 | 4.77364 | 1000.000 |

The melt composition of Table IV can be specified by the following ratios:

Al$_2$O$_3$/(Y$_2$O$_3$+ Gd$_2$O$_3$)= 3.8

PbO/2B$_2$O$_3$= 6.0

(Y$_2$O$_3$+Gd$_2$O$_3$+Al$_2$O$_3$)/(Y$_2$O$_3$+Gd$_2$O$_3$+Al$_2$O$_3$+B$_2$O$_3$+1/2PbO)=0.045

Gd$_2$O$_3$/(Y$_2$O$_3$+ Gd$_2$O$_3$)= 0.25

Y$_2$O$_3$/(Y$_2$O$_3$+ Gd$_2$O$_3$)= 0.75

The growth rate of this composition on (111) wafer substrates of YAG at the same temperature used for the epitaxial growth on the fibers was found to be about 0.95 μm/min, so that epitaxial layers of about 28.5 and 57.0 μm average thickness of epitaxial coating could be produced on fibers in 30 and 60 minutes. Table V summarizes the conditions for the growth of the compressive epitaxial layers of (Y,Gd)$_3$Al$_5$O$_{12}$ on the two YAG fibers. The fibers were axially rotated at 200 rev/min during epitaxy.

TABLE V

Conditions for Growth of Epitaxial Layers of
(Y,Gd)$_3$Al$_5$O$_{12}$ on Y$_3$Al$_5$O$_{12}$ Fibers

| Layer ID | $T_G$ | f | t | h |
| --- | --- | --- | --- | --- |
| 10917-2-2 | 1005.5 | 0.95 | 30 | 28.5 |
| 10918-2-1 | 1005.5 | 0.95 | 60 | 57.0 |

$T_G$ = growth temperature (°C.);
f = estimated growth rate (μm/min);
t = growth time (min);
h = estimated average layer thickness (μm).

These (Y, Gd)$_3$Al$_5$O$_{12}$ (Gd-YAG) coated fibers were embedded in an epoxy resin, and sliced and polished to reveal their cross-sections, which were examined by scanning electron microscopy (SEM). Electron density contrast in the SEM was used to distinguish the epitaxial layer from the fiber core. This analysis showed that the fibers were covered with an epitaxial layer in a six-sided polygon shape to a minimum depth of about 20 µm. The polygonal cross-section is indicative of the underlying crystal structure of the fiber, the flat surfaces of the polygons being facets of the garnet crystal.

EXAMPLE 2

In the manner of Example 1, epitaxial layers of the compressive-strain composition $Ho_3Al_5O_{12}$ (HoAG) were prepared on two additional 20 mm lengths of 0.5 mm diameter YAG fiber prepared by the laser heated pedestal method previously described. Epitaxy was from the melt composition shown in Table VI.

TABLE VI

| Oxide | Mole Fraction | Moles | Grams |
|---|---|---|---|
| PbO | 0.90024 | 3.42798 | 765.089 |
| $Al_2O_3$ | 0.01959 | 0.07459 | 7.606 |
| $B_2O_3$ | 0.07502 | 0.28567 | 19.888 |
| $Ho_2O_3$ | 0.00516 | 0.01963 | 7.417 |
|  | 1.00000 | 3.80787 | 800.000 |

The melt composition of Table VI can be specified by the following ratios:

$Al_2O_3/Ho_2O_3$ = 3.8

$PbO/2B_2O_3$ = 6.0

$(Ho_2O_3 + Al_2O_3)/(Ho_2O_3 + Al_2O_3 + B_2O_3 + 1/2PbO)$ = 0.045.

Epitaxy was performed at 1014° C. for 30 min. on one fiber, and 1018.5° C. for 60 min. on the other. Growth rates at these temperatures were estimated from those achieved on YAG wafer substrates at similar temperatures. The growth conditions for these layers are summarized in Table VII, below. The fibers were axially rotated at 200 rev/min during epitaxy.

TABLE VII

| Conditions for Growth of Epitaxial Layers of $Ho_3Al_5O_{12}$ on $Y_3Al_5O_{12}$ | | | |
|---|---|---|---|
| Layer ID | $T_G$ | f | t | h |
| 10924-2-2 | 1014.0 | 1.20 | 30 | 36 |
| 10925-2-1 | 1018.5 | 1.00 | 60 | 60 |

$T_G$ = growth temperature (°C.);
f = estimated growth rate (µm/min);
t = growth time (min);
h = estimated average thickness (µm).

These $Ho_3Al_5O_{12}$ (HoAG) coated fibers were embedded in an epoxy resin, sliced and polished to reveal their cross-sections, which were examined by scanning electron microscopy (SEM). In particular, electron density contrast in the SEM was used to distinguish the epitaxial layers from the fiber core. This analysis showed that the fibers were covered with an epitaxial layer of a roughly six-sided polygon shape of a minimum depth of about 30 µm. The polygonal cross-section is indicative of the underlying crystal structure of the fiber, the flat surfaces of the polygons being facets of the garnet crystal.

EXAMPLE 3

A 22 mm length of 0.0040 inch (101.6 µm) diameter YAG fiber was cut from a longer strand of YAG fiber prepared from a YAG melt by a die-pulling technique. In this technique, a "seed" crystal is touched to a melt of liquid yttrium aluminum oxide and a strand of YAG crystal fiber is pulled through a diameter-defining die. X-ray diffraction measurements showed that this fiber is a single crystal of <311> axial orientation.

An epitaxial layer of the compressive-strain composition $(Y, Gd)_3Al_5O_{12}$ (Gd-YAG) was prepared on this length of fiber using the melt described in Table IV. Epitaxy was performed at 990.5° C. for 15 minutes at a growth rate of about 1.3 µm/min, as estimated by the growth rate of this composition on a (111) wafer substrate of YAG. Optical microscopy showed that the average diameter of the fiber increased to 0.0057 inch (144.8 µm), a 42.5% increase in diameter. The quality of this epitaxial layer was much improved over that for the 0.5 mm diameter laser-heated pedestal fibers, presumably because of the improved crystallinity of the YAG fiber.

This $(Y, Gd)_3Al_5O_{12}$ (Gd-YAG) coated fiber was embedded in an epoxy resin, sliced and polished to reveal its cross-section, which was examined by scanning electron microscopy (SEM). In particular, electron density contrast in the SEM was used to distinguish the epitaxial layer from the fiber core. This analysis showed that the fiber was covered with an epitaxial layer in a six-sided polygon shape to a minimum depth of about 16 µm. The polygonal cross-section is indicative of the underlying crystal structure of the fiber, the flat surfaces of the polygons being facets of the garnet crystal.

EXAMPLE 4

This example demonstrates that the compressive stress in an epitaxial surface layer in accordance with this invention is not lost, but is fully retained after annealing at temperature as high as 0.75 times the absolute melting temperature of a YAG fiber body.

An epitaxial layer of Gd-YAG was grown on a one-inch diameter YAG substrate wafer of (111)-orientation by standard liquid phase epitaxy techniques at a growth temperature of 996.5° C. from the melt described in Table IV, above. The growth rate was about 2.4 µm/min, and a 12 µm layer of Gd-YAG was formed over the entire wafer within 5 minutes growth time. The epitaxially coated wafer thus obtained was broken in half, and one half was annealed in air at high temperature over a period of 150 minutes, during which time the temperature was raised from about 1050° C. to about 1460° C. (it was held at a temperature above about 1400° C. for about 1 hour), followed by cooling to room temperature over a period of about 45 minutes. The as-grown and annealed halves were subjected to X-ray diffraction; the measured data are shown in Table VIII, below:

TABLE VIII

|  | As-Grown | Annealed |
|---|---|---|
| $a_f$ (A, measured) | 12.0303 | 12.0312 |
| $a_s$ (A, measured) | 12.0067 | 12.0073 |
| $\Delta a$ (A, measured) | 0.0236 | 0.0239 |
| $\Delta a$(A, corr.) | 0.0142 | 0.0144 |
| Strain (%) | 0.118 | 0.12 |
| Stress (MPa) | 450 | 458 |

In Table VIII, above, $a_f$ is the lattice constant of the epitaxial layer measured normal to the face; $a_s$ is the lattice constant of the YAG substrate measured normal to the face and viewed through the epitaxial layer; $\Delta a$ (measured) is the difference in these lattice constants; $\Delta a$ (corr.) is the difference in lattice constant as corrected for strain by Poisson's ratio; Strain (%) is the compressive strain of the layer; and Stress (MPa) is the compressive stress calculated from this strain. Within limits of measurement, the compressive strain is unchanged by the anneal. As demonstrated by this Example, the surface stresses imparted by the epitaxial growth technique on YAG single crystal fibers survive for long times at surprisingly high temperatures, above 0.75 times the absolute melting temperature (about 1400° C. for YAG, which has a melting temperature of 1950° C.). This refractory state of stress, achievable with single crystal garnets, is a direct result of the lack of crystalline and structural defects including amorphous structure, free volume, mobile dislocations and grain boundaries, all of which mediate stress relaxation in glassy and polycrystalline bodies at temperatures on the order of 0.3–0.4 times the absolute melting point

EXAMPLE 5

$Ho_3Al_5O_{12}$ (HoAG) Epitaxial Layers on YAG: Retention of Wafer Bowing Due to Compressive Strain After High Temperature Anneal.

Two epitaxial layers of $Ho_3Al_5O_{12}$ (HoAG) were prepared by the liquid phase epitaxy technique on one side of one-inch diameter, 0.020-inch thick, (111)-oriented wafers of $Y_3Al_5O_{12}$ (YAG) from the melt composition listed in Table IX, below.

TABLE IX

| Oxide | Mole Fraction | Moles | Grams |
|---|---|---|---|
| $Pb_o$ | 0.90024 | 3.42798 | 765.089 |
| $Al_2O_3$ | 0.01959 | 0.07459 | 7.606 |
| $B_2O_3$ | 0.07502 | 0.28567 | 19.888 |
| $Ho_2O_3$ | 0.00516 | 0.01963 | 7.417 |
| | 1.00000 | 3.80787 | 800.000 |

The melt composition of Table IX can be specified by the following ratios:

$Al_2O_3/Ho_2O_3 = 3.8$ $PbO/2B_2O_3 = 6.0$ $(Ho_2O_3 + Al_2O_3)/(Ho_2O_3 + Al_2O_3 + B_2O_3 + 1/2PbO) = 0.045$.

The growth conditions for these layers appear in Table X, below. Substrate rotation rate in each case was 200 rev/min.

TABLE X

| Conditions for growth of epitaxial layers of $Ho_3Al_5O_{12}$ on $Y_3Al_5O_{12}$. | | | | | |
|---|---|---|---|---|---|
| Layer ID | $T_G$ | f | t | h | Comments |
| 10830-2-2 | 1003.0 | 0.37 | 120 | 44.0 | annealed |
| 11101-2-1 | 964.5 | 1.03 | 45 | 46.3 | reference |

$T_g$ = growth Temperature (°C.);
f = growth Rate (μm/min);
t = growth time (min),
h = thickness (μm).

The wafers were warped after epitaxy because of the lattice constant mismatch between the epitaxial layer and the YAG wafer, the same mismatch which induces the compressive stress state in the epitaxial wafer. This warpage is a measure of the stress state of the wafer. It was measured with a profilometer (Tencor Instruments). This radially symmetric warpage, or "bow," of a wafer can be described by the relative height of the center of the wafer with respect to points at equal and opposite distances along a diameter of the wafer. We measure units of wafer bow in μm/cm; that is, the relative height of the center of the wafer with respect to two points 5 mm distant on opposite sides of a diameter through the center.

Wafer bow was measured for the reference layer (11101-2-1) before and after epitaxial growth; and for epitaxial layer 10830-2-2 in the as-grown state, after an anneal of 1300° C. for 4.5 hours, and after a 1650° C. anneal for 1, 10, and 100 total hours. Results are summarized in Table XI, below.

TABLE XI

| Layer ID | Comments | Temp. (°C.) | Time (hr) | Bow (μm/cm) |
|---|---|---|---|---|
| 11101-2-1 | bare Wafer Ref. | — | — | 0.00 |
| 11101-2-1 | as Grown Ref. | — | — | 3.77 |
| 10830-2-2 | as Grown | — | — | 2.99 |
| 10830-2-2 | annealed | 1300 | 4.5 | 3.01 |
| 10830-2-2 | annealed | 1650 | 1 | 2.93 |
| 10830-2-2 | annealed | 1650 | 10 | 2.98 |
| 10830-2-2 | annealed | 1650 | 100 | 2.29 |

As the data in Table XI show, there is essentially no change in bow, within experimental precision, after an anneal of 1300° C. for 4.5 hours, and after a 1650° C./10 hour anneal. This means that the compressive stress state of the epitaxial layer is also unchanged After 100 hours at 1650° C. the bow was reduced to about 2.29 μm/cm, or about 75% of its initial value, indicating that substantial compressive stress was still present in the epitaxial layer.

EXAMPLE 6

$(Y,Gd)_3Al_5O_{12}$ (Gd-YAG) Epitaxial Layers on YAG: Retention of Wafer Bowing Due to Compressive Strain After High Temperature Anneal.

Two epitaxial layers of $(Y, Gd)_3Al_5O_{12}$ (Gd-YAG) were prepared on one side of one-inch diameter, 0.020-inch thick, (111)-oriented wafers of $Y_3Al_5O_{12}$ (YAG) from the melt composition listed in Table XII, below.

TABLE XII

| Oxide | Mole Fraction | Moles | Grams |
|---|---|---|---|
| PbO | 0.90024 | 4.29741 | 959.135 |
| $Al_2O_3$ | 0.01959 | 0.09351 | 9.535 |
| $B_2O_3$ | 0.07502 | 0.35812 | 24.932 |
| $Y_2O_3$ | 0.00387 | 0.01846 | 4.168 |
| $Gd_2O_3$ | 0.00129 | 0.00615 | 2.230 |
| | 1.00000 | 4.77364 | 1000.000 |

This composition can be specified by the following ratios:

$Al_2O_3/(Y_2O_3 + Gd_2O_3) = 3.8$ $PbO/2B_2O_3 = 6.0$ $(Y_2O_3 + Gd_2O_3 + Al_2O_3)/(Y_2O_3 + Gd_2O_3 + Al_2O_3 + B_2O_3 + 1/2PbO) = 0.045$ $Gd_2O_3/(Y_2O_3 + Gd_2O_3) = 0.25$ $Y_2O_3/(Y_2O_3 + Gd_2O_3) = 0.75$

The growth conditions for these layers appear in Table XIII, below. Substrate rotation rate was 200 rev/min.

TABLE XIII

| Layer ID | T_G | f | t | h |
|---|---|---|---|---|
| 20109-2-3 | 990.5 | 1.35 | 30 | 40.4 |
| 20110-2-1 | 989.5 | 1.36 | 15 | 20.4 |

$T_G$ = growth Temperature (°C.);
f = growth Rate (μm/min);
t = growth time (min),
h = thickness (μm).

Wafer bow was measured for each wafer before and after epitaxial growth; and after epitaxial growth and a 1650° C. anneal for one hour. The measurements are shown in Table XIV.

TABLE XIV

| Layer ID | Comments | Temp. (°C.) | Time (hr). | Bow (μm/cm) |
|---|---|---|---|---|
| 20109-2-3 | bare Wafer | — | — | 0.43 |
| 20110-2-1 | bare Wafer | — | — | 0.27 |
| 20109-2-3 | as Grown | — | — | 9.50 |
| 20110-2-1 | as Grown | — | — | 5.49 |
| 20109-2-3 | annealed | 1650 | 1 | 8.93 |
| 20110-2-1 | annealed | 1650 | 1 | 5.48 |

The data of Table XIV show that there is essentially no change in bow, within experimental precision after an anneal at 1650° C. for one hour. This means the compressive stress state of the epitaxial layer is also unchanged after this high temperature exposure.

EXAMPLE 7

Twelve YAG rods, 85 mm long and 5 mm diameter, were cut from a large single crystal boule by core drilling along the <111> crystallographic axis. The core drilling process produced a somewhat rough, matte surface on the rods, similar to the surface that would result from a grinding process for fabricating a shaped article from a solid YAG single crystal block. Two of the rods were held as controls, and the others were chemically polished as follows: six were pre-etched in a 3:1 by volume mixture of phosphoric and sulfuric acid at 160° C. for 30 minutes, then polished in phosphoric acid at 400° C. for 15 minutes; and the remaining four were pre-etched in a 3:1 mixture of phosphoric and sulfuric acid at 160° C. for 30 minutes, and then polished in phosphoric acid at 400° C. for 30 minutes. The fracture strength of these rods was then determined by the three-point bend test using a span of 40 mm and a crosshead rate of 0.02 in/min (0.51 mm/min). The results are summarized in Table XV, below:

TABLE XV

Fracture Strength of Unpolished (Rods 1 and 2) and Chemically Chemically Polished Rods (Rods 3-12)

| Rod No. | Removal Rate μm/min | Polishing Time minutes | Material Removed μm | Fracture Strength MPa |
|---|---|---|---|---|
| 1 | 0 | 0 | 0 | 79 |
| 2 | 0 | 0 | 0 | 140 |
| 3 | 3.25 | 15 | 48.8 | 290 |
| 4 | 3.67 | 15 | 55.1 | 285 |
| 5 | 3.96 | 15 | 59.4 | 387 |
| 6 | 6.29 | 15 | 94.4 | 522 |
| 7 | 6.69 | 15 | 100.3 | 476 |
| 8 | 7.16 | 15 | 107.4 | 809 |
| 9 | 4.52 | 30 | 135.6 | 1914 |

TABLE XV-continued

Fracture Strength of Unpolished (Rods 1 and 2) and Chemically Chemically Polished Rods (Rods 3-12)

| Rod No. | Removal Rate μm/min | Polishing Time minutes | Material Removed μm | Fracture Strength MPa |
|---|---|---|---|---|
| 10 | 5.13 | 30 | 153.9 | 682 |
| 11 | 5.62 | 30 | 168.6 | 656 |
| 12 | 6.54 | 30 | 196.2 | 750 |

As the data in Table XV show, the fracture strength of the chemically polished rods significantly exceeds that of the unpolished rods. A certain critical removal of surface material must be obtained to overcome the detrimental effects of the machining process. The fracture strength of Rod No. 9, which is measured at 1914 MPa, should be considered a high material strength, since is is more than 1% of the shear modulus of YAG.

EXAMPLE 8

Surface flow tolerance tests on coated YAG wafers and an uncoated YAG wafer control were conducted as follows. The samples were indented under various loads using a Vickers diamond pyramid indentor. The indented samples were then strength tested using the ball-on-disk method of ASTM Standard F394. The test results are summarized in Table XVI, below. The test samples were as follows:

Control: uncoated YAG wafers, 0.5 mm thick (designated "Control" in Table XVI);

Sample 1: YAG wafers, 0.5 mm thick, coated with epitaxial dysprosium aluminum garnet (DAG), 5.35±0.45 μm thick DAG coating (designated "DAG on YAG" in Table XVI); and Sample 2: YAG wafers, 0.5 mm thick, first coated with epitaxial holmium aluminum garnet (HoAG), 34.6±4.0 μm thick, followed by a coating of epitaxial dysprosium aluminum garnet (DAG), 5.6±0.6 μm thick (designated "DAG on HoAG on YAG" in Table XVI).

The test results are summarized in Table XVI, below.

TABLE XVI

| | Mean Fracture Strength (MPa) [FIGURES in ( ) denote Std. Deviation] | | |
|---|---|---|---|
| Indentation Load (g) | Control | DAG on YAG | DAG on HoAG on YAG |
| 5 | 417 (47.5) | 1,196 (22.6) | |
| 15 | 465 (245.1) | 1,074 (254.7) | |
| 50 | 263 (41.8) | 1,156 (473.3) | |
| 100 | 176 (14.1) | | |
| 150 | | 374 (35.6) | 462 (43.4) |
| 500 | | 182 (33) | 291 (19.9) |

EXAMPLE 9

Eight layers of (dysprosium,holmium)-aluminum garnet with 0.14% compressive strain were prepared on YAG wafers with thickness 28.8±2.9 μm from the melt composition specified in Table XVII. These layers were prepared at a temperature of 882±13° C. at a growth rate of 0.68±0.12 μm/min.

TABLE XVII

Composition of melt for growth of epitaxial layers of (dysprosium, holmium)-aluminum garnet with 0.14% compressive strain on yttrium aluminum garnet.

| Oxide | Mole Fraction | Moles | Grams |
| --- | --- | --- | --- |
| PbO | 0.90539 | 4.3040 | 960.558 |
| $Al_2O_3$ | 0.01516 | 0.0720 | 7.350 |
| $B_2O_3$ | 0.07545 | 0.3590 | 24.970 |
| $Dy_2O_3$ | 0.00200 | 0.0095 | 3.538 |
| $Ho_2O_3$ | 0.00200 | 0.0095 | 3.584 |
| Totals | 1.00000 | 4.7540 | 1000.000 |

Four of these wafers were indented at 200 grams with a vickers diamond pyramid indentor, and the other four were indented at 500 grams. These were fracture tested at room temperature using the ball-on-disk method (ASTM Standard F394), and the test data appear in Table XVIII.

TABLE XVIII

Room temperature indentation fracture strength for epitaxial layers of (dysprosium, holmium)-aluminum garnet with 0.14% compressive strain on yttrium aluminum garnet.

| Compressive Strain (%) | Indentation Load (g) | Mean Fracture Stress (MPa) | Standard Deviation of Fracture Stress |
| --- | --- | --- | --- |
| 0.14 | 200 | 825 | 20 |
| 0.14 | 500 | 764 | 39 |

These data show that significant strength is retained after indentation damage.

EXAMPLE 10

Eight layers of (dysprosium,holmium)-aluminum garnet with 0.21% compressive strain were prepared on YAG wafers with thickness 26.6± 0.8 μm from the melt composition specified in Table XIX. These layers were prepared at a temperature of 894± 11° C. at a growth rate of 0.89± 0.03 μm/min.

TABLE XIX

Composition of melt for growth of epitaxial layers of (dysprosium, holmium)-aluminum garnet with 0.21% compressive strain on yttrium aluminum garnet

| Oxide | Mole Fraction | Moles | Grams |
| --- | --- | --- | --- |
| PbO | 0.90539 | 4.3040 | 960.577 |
| $Al_2O_3$ | 0.01516 | 0.0720 | 7.350 |
| $B_2O_3$ | 0.07545 | 0.3590 | 24.970 |
| $Dy_2O_3$ | 0.00280 | 0.0133 | 4.953 |
| $HO_2O_3$ | 0.00120 | 0.0057 | 2.150 |
| Totals | 1.00000 | 4.7540 | 1000.000 |

Four of these wafers were indented at 200 grams with a vickers diamond pyramid indentor, and the other four were indented at 500 grams. These were fracture tested at room temperature using the ball-on-disk method (ASTM Standard F394), and the test data appear in Table XX.

TABLE XX

Room temperature indentation fracture strength for epitaxial layers of (dysprosium, holmium)-aluminum garnet with 0.21% compressive strain on yttrium aluminum garnet.

| Compressive Strain (%) | Indentation Load (g) | Mean Fracture Stress (MPa) | Standard Deviation of Fracture Stress |
| --- | --- | --- | --- |
| 0.21 | 200 | 1024 | 95 |
| 0.21 | 500 | 970 | 29 |

These data show that significant strength is retained after indentation damage.

EXAMPLE 11

Five YAG wafers, each 0.5 mm thick, were coated with 5.35± 0.45 μm thick dysprosium aluminum garnet compressive layers. The coated wafers were then indented at a load of 50 grams using a Vickers diamond pyramid indentor. The indented wafers were then strength tested in a argon filled furnace at 1500° C. using the ball-on-disk method of ASTM Standard F394. They had a mean fracture stress of 1246 MPa with a 182 MPa standard deviation. These results indicate high surface flaw tolerance at 1500° C.

As previously stated, the epitaxial garnet layer can also be provided by means of chemical vapor deposition employing known procedures, for example the procedure described by Mee et al. in *Chemical Vapor Deposition of Epitaxial YIG on YAG and Epitaxial GdIG on YAG, Appl. Phys. Lett.* 10, No.10, 289–291 (1967).

The thickness of the epitaxial layer should be in the order of from about 0.5 μm to about 500 μm, more desirably in the order of from about 1 μm to about 100 μm, and preferably from about 2 μm to about 20 μm.

The methods for growing the single crystal fiber body and for depositing the epitaxial garnet layer all employ techniques which individually are known to those skilled in the art.

Known oxide single crystal fibers, which lack the compressive coating, tend to have a wide statistical distribution of strength due to the presence of strength limiting surface flaws introduced during fiber processing. Additional fiber surface damage introduced during composite fabrication further degrades fiber and therefore composite strength. The epitaxially surface strengthened fibers of the present invention resist the strength limiting effects of process and handling induced surface damage and therefore yield composite materials with superior performance with regard to strength and toughness.

The term "fiber" for present purposes, refers to an elongated body, of any desired cross-section, having cross-sectional dimension ("diameter"), measured at its widest point, of less than about 625 μm, and having a length:diameter ratio of at least about 5:1. Desirably, the largest cross-sectional dimension is less than about 250 μm, preferably less than about 100 μm, and most preferred less than about 50 μm. The cross-sectional shape may be round, oblong, square, rectangular, lobed or any other form to suit desired applications and requirements. The cross-sectional shapes may be readily obtained by use of the edge defined film fed growth method. Cross-sectional shapes other than round or rounded shapes may be desirable to optimize strength characteristics of the composites into which these fibers are to be fabricated, for example to provide better interlock between the matrix and fibers, and the like.

The epitaxially surface strengthened fibers of the present invention are especially suited for use in composites for demanding high temperature applications, such as leading edges in high speed aerospace vehicles and airfoils for the hot section of turbine engines, for example. To that end, the fibers are incorporated into the matrix material which is to be reinforced. Any compatible matrix material may be so reinforced.

The matrix material may be of organic (polymeric) nature, or it may be an inorganic material, as a glassy or ceramic material, or a metal. Exemplary organic matrix materials include polyester resins; epoxy resins; thermosetting resins including polybutadiene, vinyl ester polymers and polyimide; and thermoplastics such as the nylons, the polysulfones, polyetherketone, polyetherimide; as well as any of the other polymeric substances which are conventionally employed for composite matrix applications. Of course, a polymer matrix cannot fully utilize the advantageous high temperature performance characterists of the fibers of the present invention, since the polymers are not suitable for use at high temperatures for which the fibers of the present invention are so eminently suited. Exemplary suitable inorganic matrix materials include glass, e.g., silicate glass; ceramics such as yttrium aluminum garnet and mullite; and metals, such as aluminum, magnesium, iron, nickel, copper and others which melt below the melting point of the reinforcing fiber, and alloys of these metals. Inorganic materials can fully benefit from the high temperature performance characteristics of these fibers.

For optimum results, the following factors deserve consideration:

First, the fibers desirably should have a sufficiently weak interface with respect to an inorganic matrix, so that under force they can be separated from and pulled out from the matrix, albeit with considerable resistance, without substantial damage to the fiber. The energy dissipated in this separation provides resistance to fracture propagation.

Second, the matrix composition desirably has a coefficient of thermal expansion that is less than or equal to that of the fiber. If the thermal expansion coefficient of the matrix is greater than that of the fiber, the contraction of the matrix material in the course of fabrication of the composites (cooling from composite fabrication temperature) may crush the fiber, resulting in radial cracks in the matrix and a high compressive loading at the fiber-matrix interface. This weakens the matrix and tends to prevent clean separation of the fiber from the matix under force, and is therefore undesirable. On the other hand, if the thermal expansion coefficient of the matrix is smaller than that of the fiber, the fiber will pull away from the matrix when the composite is cooled from the composite forming temperature, resulting in a weak contact between the fiber and the matrix.

For example, YAG is an excellent matrix material for use with YAG fiber. In that case, fiber and matrix have the same thermal expansion coefficient, and they are otherwise compatible. Alumina and mullite are other exemplary matrix materials for use with the invention fibers.

It should also be considered whether the matrix compositions has a tendency to react with the fiber chemically, as for example, zirconia may react with YAG by extracting $Y_2O_3$ from the YAG fiber. Alumina and YAG form a eutectic at 1800° C., and the two phases will be stable up to this temperature without incipient melting.

To prevent or minimize fiber/matrix chemical interaction at higher temperatures, the fiber may be provided with a protective coating which is thermodynamically stable with respect to the matrix and the fiber. Desirably the coating material should have a low energy of fracture (less than about 20% of that of the fiber). The fiber coating then can serve to deflect the matrix cracks from penetrating the fiber and divert it to the fiber-matrix interface. Platinum is an exemplary suitable coating for this purpose. It neither reacts with the aluminum garnet fiber, nor with the matrix materials. It is stable in an oxidizing environment. Since it is ductile and deforms easily, any matrix crack will tend to be blunted by the ductility of the platinum, and will propagate along the interface due to the low strength and modulus of the platinum. Platinum can be applied by a variety of methods including electrochemical methods, CVD and evaporation. Another suitable coatings include $SnO_2$, which forms a eutectic with alumina at 1620° C. and is stable up to 1620° C. and has relatively low strength, both of which recommend it for present application. $SnO_2$ can be applied by pyrolysis or CVD, as is conventional. Other exemplary coating compositions for use with the aluminum garnet fibers, especialy for use with YAG fibers, include $Y_2O_3 \cdot ZrO_2$ and $3MgO \cdot Y_2O_3$.

The fibers are incorporated into the matrix material in the form of unidirectional tape, as fabric, chopped and aligned, and randomly distributed. Such arrangements per se are conventional. The fiber, in one or more of these forms, is embedded into the matrix material, and the matrix is cured to the desired solid state, if necessary, as is conventional. Usually, this involves pressing the fiber-containing matrix into desired shape, followed by thermal curing. Fibers may be incorporated into a metal matrix by methods such as melt infiltration or embedment into metal powder, followed by pressing, e.g. hot isostatic pressing. Such methods are known to those skilled in the art. A composite may also be formed by chemical vapor infiltration of a suitable matrix into a low density array of coated fiber.

Typical objects that can be made using ceramic matrix composite include combustor liners, nozzle parts for ram jet or scram jet configurations, and the like. In general, these are components which must withstand loading at high temperature and fail gracefully at the expense of time dependent deformation.

We claim:

1. A reinforcement fiber comprising a fiber body formed from a single crystal aluminum garnet, said fiber body having deposited thereon an epitaxial aluminum garnet layer which provides a strain of from about 0.02 to about 0.40 percent on said single crystal fiber body.

2. The reinforcement fiber of claim 1 wherein the compressive strain is from about 0.02 to about 0.20 percent.

3. The reinforcement fiber of claim 2 wherein said single crystal garnet is a single crystal rare earth aluminum garnet, and said epitaxial garnet layer is a rare earth aluminum garnet layer.

4. The reinforcement fiber of claim 2 wherein said single crystal garnet is a single crystal garnet having the composition $RE_3Al_3Sc_2O_{12}$ wherein RE is one or more of the rare earth elements selected from the group consisting of Y, Dy, Tb, Gd and Eu.

5. The reinforcement fiber of claim 2 wherein said single crystal garnet is a single crystal yttrium aluminum garnet.

6. The reinforcement fiber of claim 5 wherein said epitaxial garnet layer is an yttrium aluminum garnet substituted with a rare earth element selected from the group consisting of Ho, Dy, Tb, Gd, Eu, Sm, Nd, Pr and La, and mixtures thereof.

7. The reinforcement fiber of claim 6 wherein said epitaxial garnet layer is an epitaxial gadolinium-alloyed yttrium aluminum garnet.

8. The reinforcement fiber of claim 1 wherein said single crystal garnet body is selected from garnets of the composition $Dy_3Al_3Sc_2O_{12}$, $Tb_3Al_3Sc_2O_{12}$, $Gd_3Al_3Sc_2O_{12}$ and $Eu_3Al_3Sc_2O_{12}$.

9. The reinforcement fiber of claim 1 wherein said single crystal garnet body is an yttrium aluminum garnet, and said epitaxial garnet layer is dysprosium aluminum garnet layer.

10. The reinforcement fiber of claim 1 wherein said single crystal garnet body is an holmium aluminum garnet, and said epitaxial garnet layer is dysprosium aluminum garnet layer.

11. The reinforcement fiber of claim 1 wherein said single crystal garnet body is an yttrium aluminum garnet which is coated with a first epitaxial holmium aluminum garnet layer, having deposited thereon an epitaxial dysprosium aluminum garnet layer.

12. The reinforcement fiber of claim 2 wherein said single crystal garnet body has been subjected to a chemical polishing treatment before deposition of said epitaxial garnet layer.

13. The reinforcement fiber of claim 7 wherein said single crystal garnet body has been subjected to a chemical polishing treatment before deposition of said epitaxial garnet layer.

14. The reinforcement fiber of claim 13 wherein said single crystal garnet body has been subjected to a hot phosphoric acid polishing treatment before deposition of said epitaxial garnet layer.

15. The reinforcement fiber of claim 14 wherein said single crystal garnet body has been subjected to a hot phosphoric acid polishing treatment before deposition of said epitaxial garnet layer, to a depth sufficient to provide in the garnet body an elastic strain at fracture of at least $10^{-3}$.

16. The reinforcement fiber of claim 7 wherein said eptitaxial garnet layer has a thickness of from about 1 μm to about 100 μm.

17. The reinforcement fiber of claim 2 comprising two or more successive epitaxial layers, each having a lattice constant larger than the preceeding layer.

18. The reinforcement fiber of claim 17 wherein the single crystal garnet body is an yttrium aluminum garnet.

19. The reinforcement fiber of claim 18 wherein the compressive strain resulting from lattice mismatch between the single crystal garnet body and the first epitaxial garnet layer, and between each successive epitaxial garnet layer, is from about 0.02 to about 0.15.

20. The method of forming a reinforcement fiber which comprises, in combination:

(a) growing a fiber of a single crystal aluminum garnet;

(b) epitaxially depositing on said fiber an aluminum garnet layer having a lattice constant larger than the lattice constant of said single crystal aluminum garnet of said fiber, wherein the lattice mismatch is sufficient to provide a compressive strain of from about 0.02 to about 0.15 percent.

21. The method of claim 20 wherein said single crystal fiber is an yttrium aluminum garnet.

22. The method of claim 20 wherein said epitaxial aluminum garnet layer is deposited by liquid phase epitaxy.

23. The method of claim 20 wherein said epitaxial aluminum garnet layer is deposited by chemical vapor deposition.

* * * * *